United States Patent
Wang et al.

(10) Patent No.: US 7,789,535 B2
(45) Date of Patent: Sep. 7, 2010

(54) LIGHT SOURCE DEVICE WITH HIGH HEAT-DISSIPATION EFFICIENCY

(75) Inventors: Chun-Wei Wang, Miao-Li Hsien (TW); Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/488,716

(22) Filed: Jun. 22, 2009

(65) Prior Publication Data

US 2010/0046197 A1 Feb. 25, 2010

(30) Foreign Application Priority Data

Aug. 25, 2008 (CN) .......................... 2008 1 0304169

(51) Int. Cl.
*F21V 29/00* (2006.01)
(52) U.S. Cl. ..................................... 362/294; 362/373
(58) Field of Classification Search ................. 362/294, 362/373, 298–301, 328, 800, 249.02; 257/98–100
See application file for complete search history.

(56) References Cited

U.S. PATENT DOCUMENTS

| | | | | |
|---|---|---|---|---|
| 6,982,518 B2 * | 1/2006 | Chou et al. | ................... | 313/46 |
| 7,025,464 B2 * | 4/2006 | Beeson et al. | ................. | 353/98 |
| 7,431,463 B2 * | 10/2008 | Beeson et al. | ................. | 353/94 |
| 7,549,774 B2 * | 6/2009 | Tsai | ........................... | 362/294 |
| 2007/0138497 A1 * | 6/2007 | Loh | ............................ | 257/98 |

* cited by examiner

*Primary Examiner*—Thomas M Sember
(74) *Attorney, Agent, or Firm*—Clifford O. Chi

(57) ABSTRACT

A light source device includes a circuit board, a solid state lighting element, and a hollow cylindrical metal reflector. The circuit board has a circuit layer formed thereon. The solid state lighting element is placed on the circuit board and electrically connected to the circuit layer. The hollow cylindrical metal reflector is placed on the circuit board and insulated from the circuit layer. An inner surface of the reflector surrounds the solid state lighting element to reflect and direct light from the solid state lighting element towards an opposite side of the reflector to the solid state lighting element.

1 Claim, 5 Drawing Sheets

LIGHT SOURCE DEVICE WITH HIGH HEAT-DISSIPATION EFFICIENCY

BACKGROUND

1. Technical Field

The disclosure relates to light source devices with high heat-dissipation efficiency.

2. Description of Related Art

Light emitting diodes, and specifically the electrical and optical characteristics and lifespan thereof, are easily influenced by temperature. High working temperatures can deteriorate internal quantum efficiency of the LED and shorten the lifespan thereof. Furthermore, resistance of the semiconductor generates a negative temperature coefficient and tends to be reduced with an increase in the working temperature. Such reduced resistance correspondingly results in stronger current at given voltages as well as the generation of excessive heat. If the excessive heat is not effectively dissipated, heat accumulation can lead to deterioration of the LED.

Referring to FIG. 4, a typical light source device 10 includes a shell 11, a light source module 12, and a cover 13. The light source module 12 is received in the shell 11. The cover 13 is located on and protects the light source module 12. The light source module 12 includes a printed circuit board 121, a circuit layer 122, a number of lighting elements 123 (such as light emitting diodes), and an encapsulant 124. The circuit layer 122 and lighting elements 123 are mounted on the printed circuit board 121. The lighting elements 123 are electrically connected to the circuit layer 122. The encapsulant 124 is positioned on the printed circuit board 121 to package the lighting elements 123. While excessive heat from the light source module 12 is dissipated through the shell 11, thermal conductivity thereof is less than optimal, such that the excessive heat is not effectively dissipated.

Therefore, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
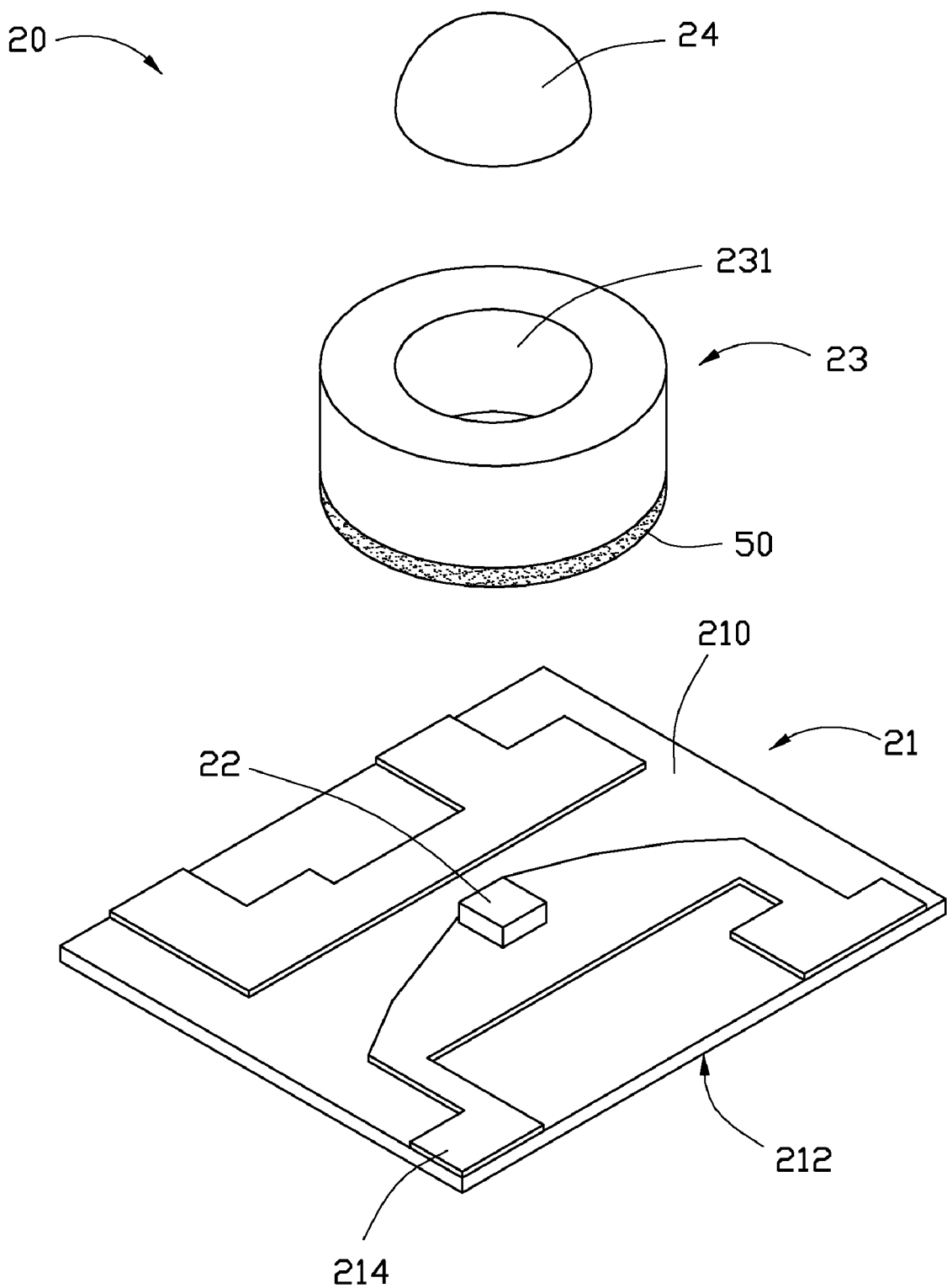
FIG. 1 is a disassembled, schematic view of a first exemplary embodiment of a light source device.

Referring to FIG. 1, a first embodiment of a light source device 20 is provided. The light source device 20 includes a circuit board 21, a solid state lighting element 22, a reflector 23, and an encapsulant 24.

The circuit board 21 includes a first surface 210 and a second surface 212 opposite to the first surface 210. A circuit layer 214 is formed on the first surface 210 of the circuit board 21. The circuit board 21 may be made of $Al_2O_3$, AlN, BeO, or other ceramic materials. Alternatively, the circuit board 21 may be a silicon substrate, metal core printed circuit board (MCPCB), etc.

In the illustrated embodiment, the solid state lighting element 22 is a light emitting diode chip (LED chip), which is placed on the first surface 210 of the circuit board 21 and electrically connected to the circuit layer 214.

Figure 5:
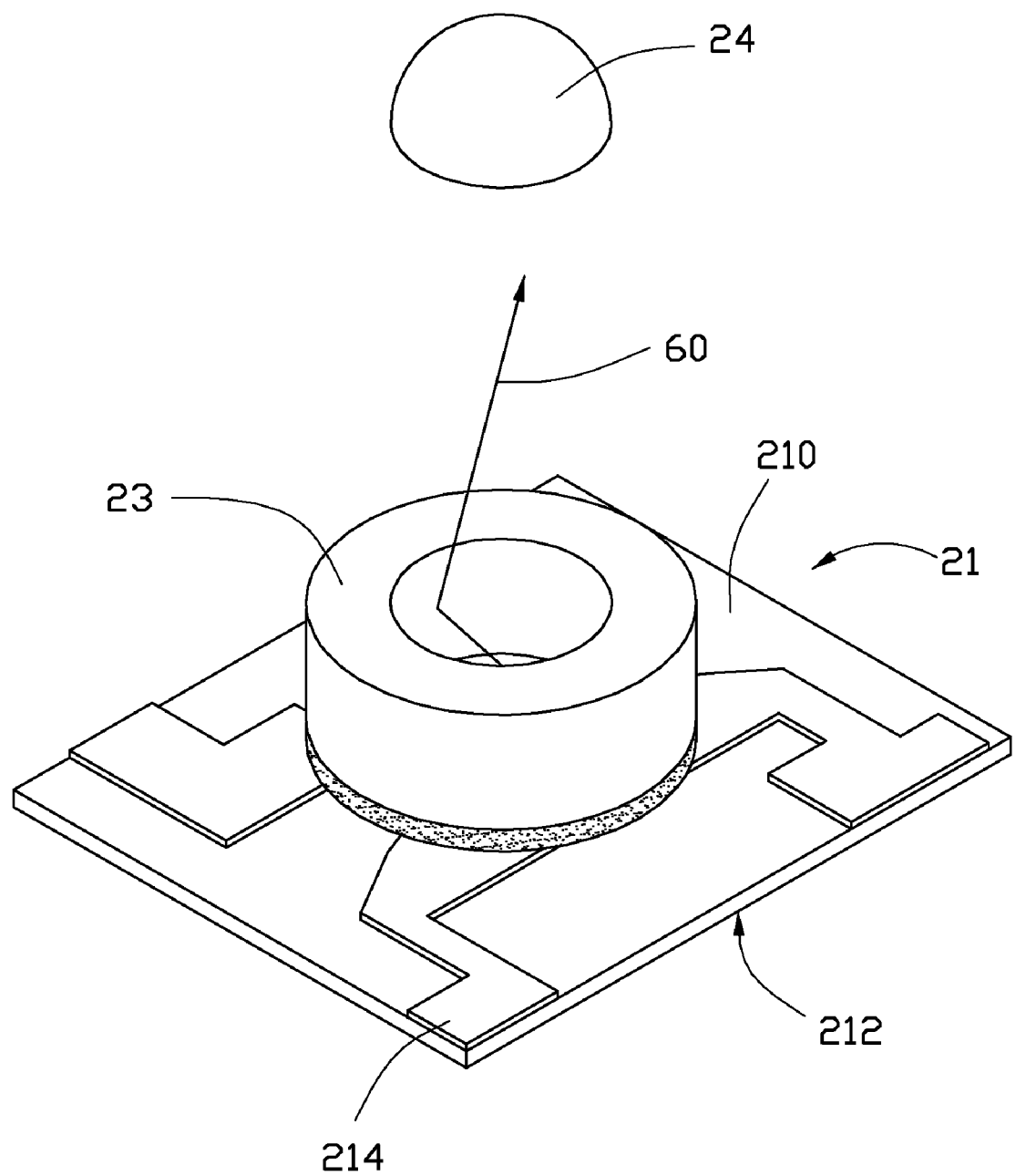
FIG. 5 shows a reflector assembled to a circuit hoard of the light source device of FIG. 1, wherein light is reflected by the reflector outwardly.

Also referring to FIG. 5, the reflector 23 has a hollow column structure, such as a hollow cylinder. The reflector 23 can be made of metal such as copper, aluminum or other, thus the reflector 23 has good heat-dissipation efficiency. The reflector 23 is placed on the first surface 210 of the circuit board 21 and surrounds the solid state lighting element, 22. An inner surface 231 of the reflector 23 surrounding the solid state lighting element 22 reflects and directs light 60 from the solid state lighting element 22 towards an opposite side of the reflector 23 to the solid state lighting element 22, to change view angle of the solid state lighting element 22. The reflector 23 may be connected to the circuit layer 214 via an insulating thermal conductivity of plastic 50, so as to improve electrical insulation between the reflector 23 and the circuit board 21. Because the reflector 23 has good heat-dissipation efficiency, heat from the solid state lighting element 22 is effectively dissipated by the reflector 23 away from the solid state lighting element 22, thereby heat-dissipation efficiency of the light source device 20 is optimized.

The encapsulant 24 is received in the hollow reflector 23 to cover the solid state lighting element 22 for protection from mechanical damage, moisture, and atmospheric exposure. The encapsulant 24 may be a condenser lens to collect light from the solid state lighting element 22 and redirects it upwards, such that the light path of the light source device 20 can be altered. The encapsulant 24 may be epoxy resin, silicone resin, or other electrically insulating transparent materials. The encapsulant 24 may further include a plurality of phosphor particles doped therein. For example, the solid state lighting element 22 may be a blue LED chip and the phosphor particles a yellow phosphor, whereby the yellow phosphor, excited by blue light from the solid state lighting element 22, emit yellow light, with white light formed by the combination of yellow and original blue light emits out from the lampshade traverse the encapsulant 24. The phosphor particles may be YAG phosphor, TAG phosphor, silicate phosphor, nitride phosphor, etc.

Figure 2:
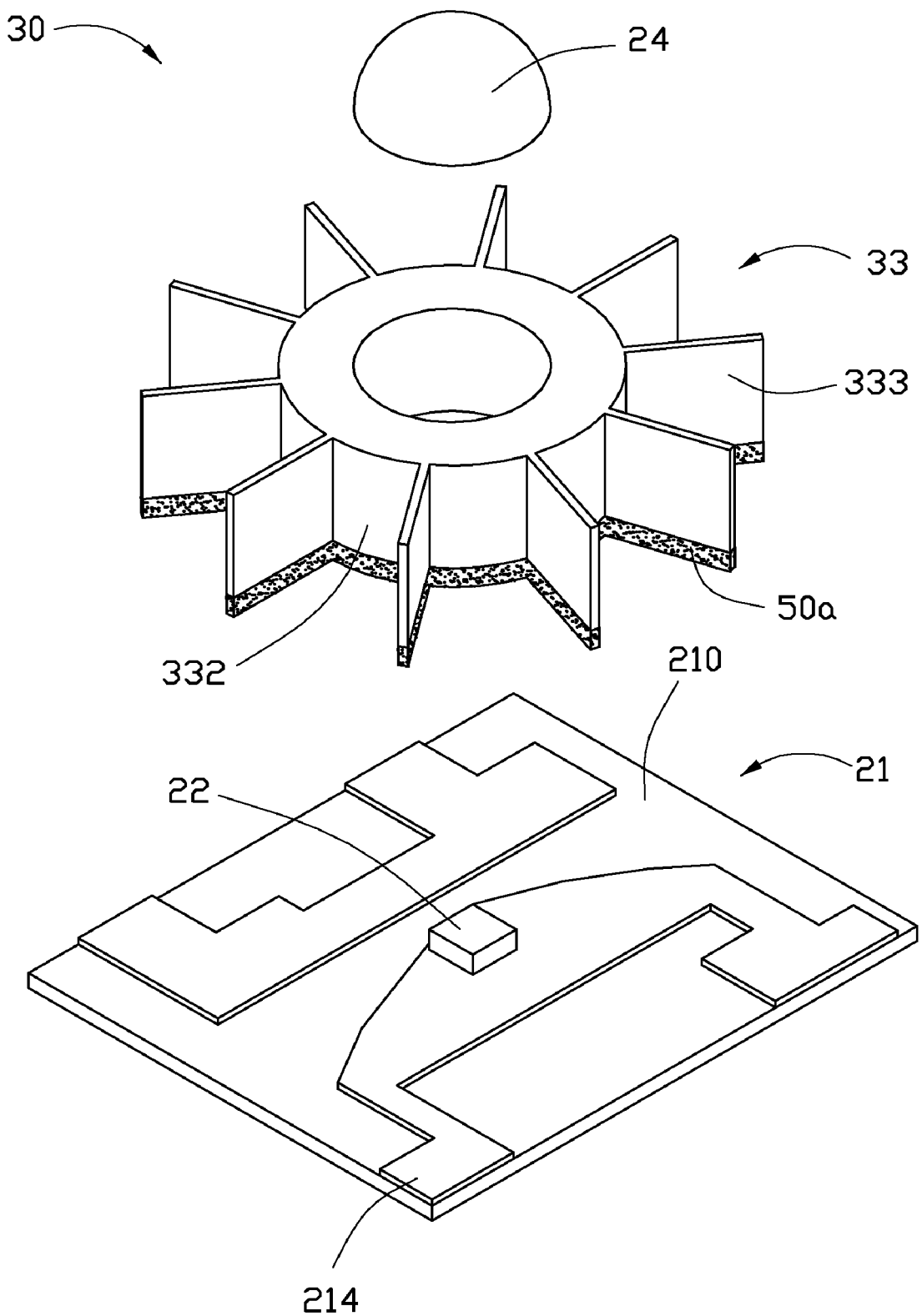
FIG. 2 is a disassembled, schematic view of a second exemplary embodiment of a light source device.

Referring to FIG. 2, a second exemplary embodiment of a light source device 30 is similar to the first embodiment of the light source device 20, except that a plurality of fins 333 radially extends from an outer surface 332 of a reflector 33, to increase heat radiating area of the reflector 33, the heat-dissipation efficiency of the light source device 30 may be further improved. The fins 333 may be connected to the circuit layer 214 via an insulating thermal conductivity of plastic 50a, so as to form a thermally connection between the tins 333 and the circuit layer 214. Alternatively, the tins 333 may be isolated to the circuit layer 214.

Figure 3:
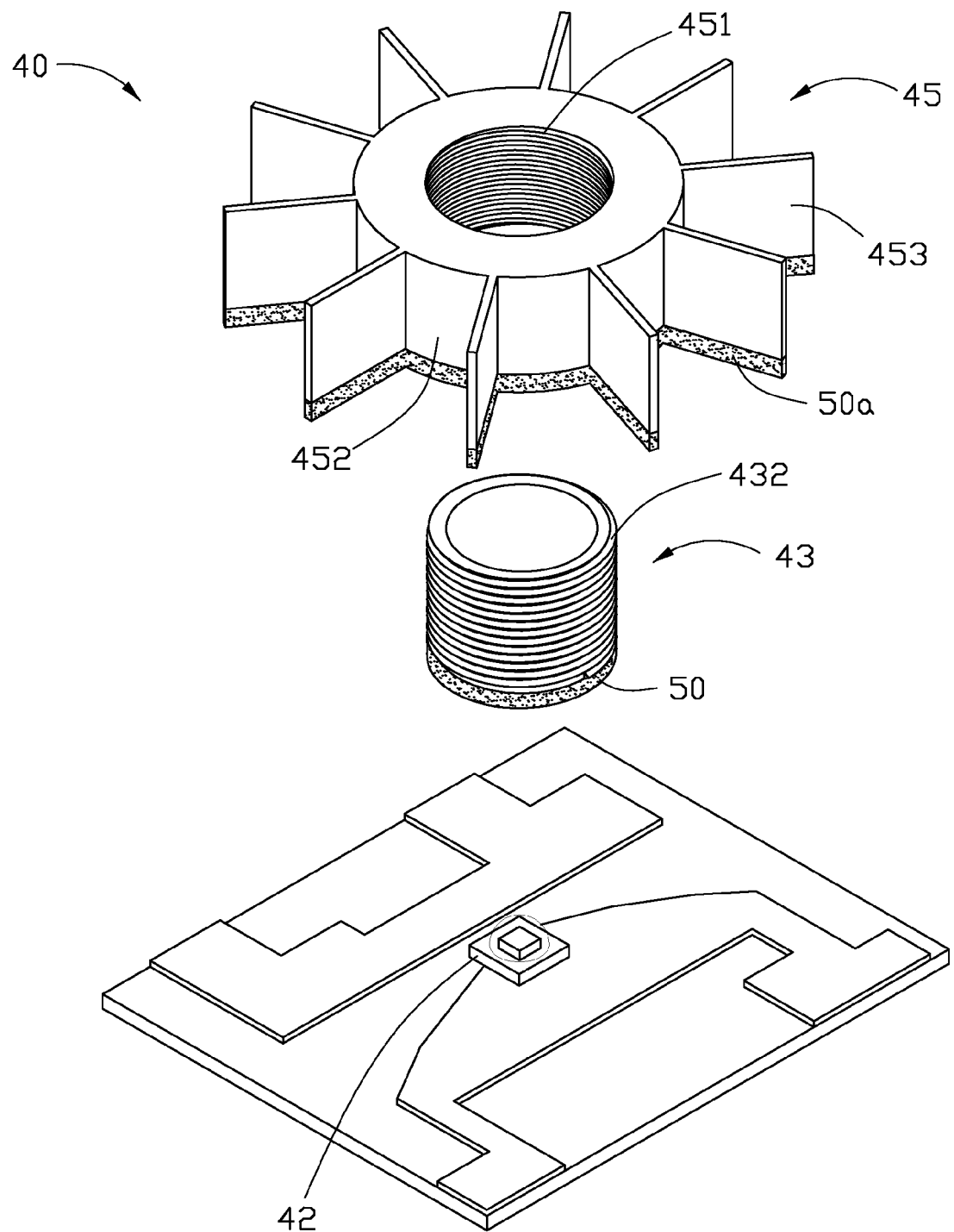
FIG. 3 is a disassembled, schematic view of a third exemplary embodiment of a light source device.
Figure 4:
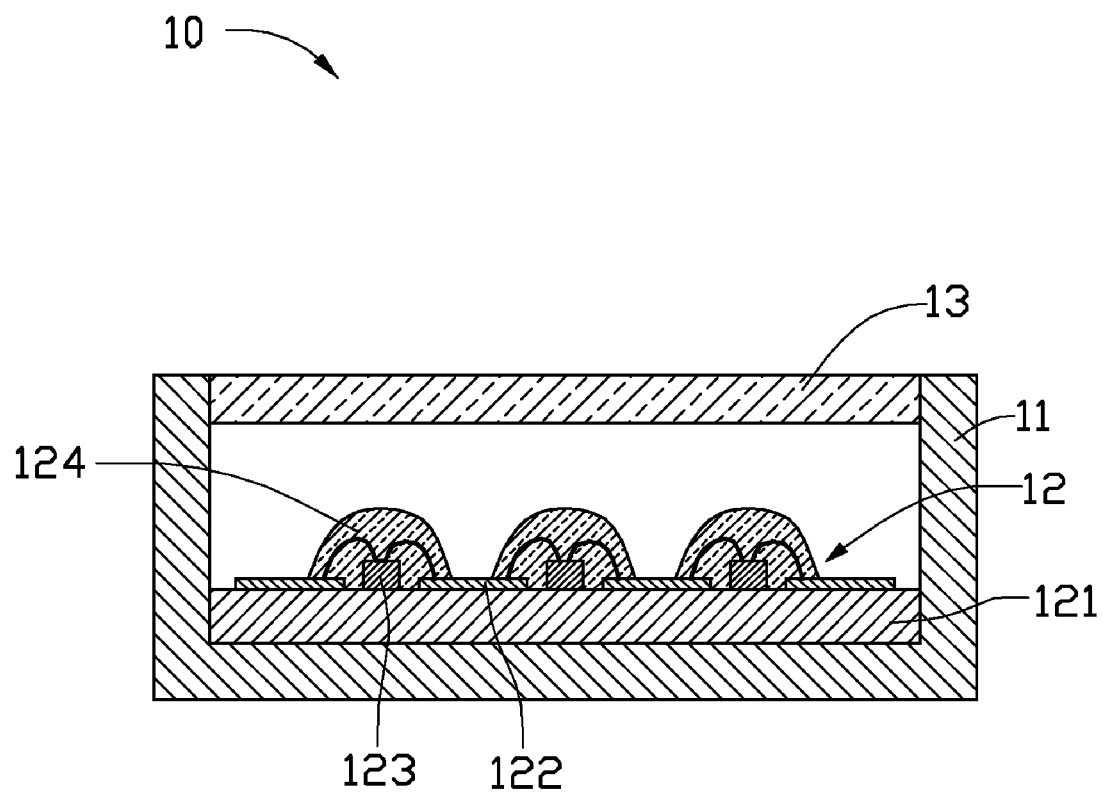
FIG. 4 is a schematic cross-section of a typical light source device, in accordance with the related art.

Referring to FIG. 3, a third exemplary embodiment of a light source device 40 is similar to the first embodiment of the light source device 20, except that light source device 40 includes a reflector 43 and a heat conductor 45.

The reflector 43 differs from reflector 23 of the first embodiment in that an outer surface 432 of a reflector 43 has outer threads thereon.

The heat conductor 45 differs from reflector 23 of the first embodiment in that an inner surface 451 of a heat conductor 45 has inner threads thereon, and a plurality of fins 453 radially extends from an outer surface 452 of the reflector 43, so that the heat conductor 45 can be threadingly engaged with the reflector 43, the assembly flexibility of the light source device 40 may be improved. Because the heat conductor 45 and the reflector 43 have good heat-dissipation efficiency as the reflector 23 of the first embodiment, heat from a solid state lighting element 42 is effectively dissipated by the reflector 43 and the heat conductor 45 away from the solid state lighting element 42, thereby heat-dissipation efficiency of the light source device 40 is optimized. It can be understood that, the heat conductor 45 may be mechanically engaged with the reflector 43 in other fashion, such as concave and convex matching, so long as the heat conductor 45 can be detachably mounted to the reflector 43. In addition, the solid state lighting element 42 is a light emitting diode in the illustrated embodiment.

It is believed that the present embodiments and their advantages will be understood from the foregoing description, and it will be apparent that various changes may be made thereto without departing from the spirit and scope of the embodiments or sacrificing all of its material advantages.

What is claimed is:
1. A light source device, comprising:
a circuit board with a circuit layer formed thereon;
a solid state lighting element placed on the circuit board and electrically connected to the circuit layer;
a hollow cylindrical metal reflector placed on the circuit board and electrically insulated from the circuit layer, an inner surface of the reflector surrounding the solid state lighting element to reflect and direct light from the solid state lighting element towards an opposite side of the reflector to the solid state lighting element; and
a hollow cylindrical heat conductor surrounding the reflector therein and threadably engaged with the reflector, the heat conductor having a plurality of fins radially extends from an outer surface thereof, the heat conductor being detachably mounted to the reflector and the fins being electrically insulated from the circuit layer;
wherein an insulating thermal conductivity material is sandwiched between the reflector and the circuit layer.

* * * * *